US012609666B2

(12) United States Patent
An et al.

(10) Patent No.: US 12,609,666 B2
(45) Date of Patent: Apr. 21, 2026

(54) FILTER, MANUFACTURING METHOD THEREOF AND ELECTRONIC APPARATUS

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Qichang An, Beijing (CN); Yuelei Xiao, Beijing (CN); Yue Li, Beijing (CN); Yifan Wu, Beijing (CN); Yulin Feng, Beijing (CN); Huiying Li, Beijing (CN); Xue Cao, Beijing (CN); Qiuxu Wei, Beijing (CN); Lihui Wang, Beijing (CN); Yanfei Ren, Beijing (CN); Wenbo Chang, Beijing (CN); Kidong Han, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 135 days.

(21) Appl. No.: 18/290,744

(22) PCT Filed: Aug. 29, 2022

(86) PCT No.: PCT/CN2022/115408
§ 371 (c)(1),
(2) Date: Jan. 19, 2024

(87) PCT Pub. No.: WO2024/044871
PCT Pub. Date: Mar. 7, 2024

(65) Prior Publication Data
US 2025/0105812 A1      Mar. 27, 2025

(51) Int. Cl.
*H03H 7/01* (2006.01)
*H05K 1/02* (2006.01)
(Continued)

(52) U.S. Cl.
CPC ......... *H03H 7/0115* (2013.01); *H05K 1/0243* (2013.01); *H05K 1/165* (2013.01); *H05K 3/30* (2013.01)

(58) Field of Classification Search
CPC ......... H03H 7/0115; H03H 2001/0085; H05K 1/0243; H05K 1/165
(Continued)

(56) References Cited

FOREIGN PATENT DOCUMENTS

| CN | 104103528 A | 10/2014 |
| CN | 209641645 U | 11/2019 |

(Continued)

*Primary Examiner* — Rakesh B Patel
(74) *Attorney, Agent, or Firm* — Nath, Goldberg & Meyer; Joshua B. Goldberg

(57) ABSTRACT

A filter, a method for manufacturing a filter and an electronic apparatus are provided, and belongs to the field of passive device technology. The filter includes a dielectric substrate, and at least one inductor and at least one capacitor integrated thereon. The dielectric substrate includes first connection vias penetrating through the dielectric substrate in a thickness direction thereof, and opposite first and second surfaces in the thickness direction. Each inductor includes first and second conductive structures respectively on the first and second surfaces, and first connection electrodes in the first connection vias. The first conductive structures and the second conductive structures form a coil structure of the inductor by the first connection electrodes. A buffer layer is provided between the first conductive structures and the first surface. Each first conductive structure is electrically connected to the first connection electrode by a second connection via penetrating through the buffer layer.

19 Claims, 8 Drawing Sheets

(51) Int. Cl.
  *H05K 1/16*          (2006.01)
  *H05K 3/30*          (2006.01)
(58) Field of Classification Search
  USPC ................................................. 333/175, 185
  See application file for complete search history.

(56)                   References Cited

FOREIGN PATENT DOCUMENTS

| | | | |
|---|---|---|---|
| CN | 111312697 A | 6/2020 |
| CN | 111739870 A | 10/2020 |
| CN | 111816608 A | 10/2020 |
| CN | 112908943 A | 6/2021 |
| CN | 114070220 A | 2/2022 |
| CN | 114070222 A | 2/2022 |
| CN | 114520222 A | 5/2022 |
| JP | 2015070189 A | 4/2015 |
| JP | 2019083282 A | 5/2019 |

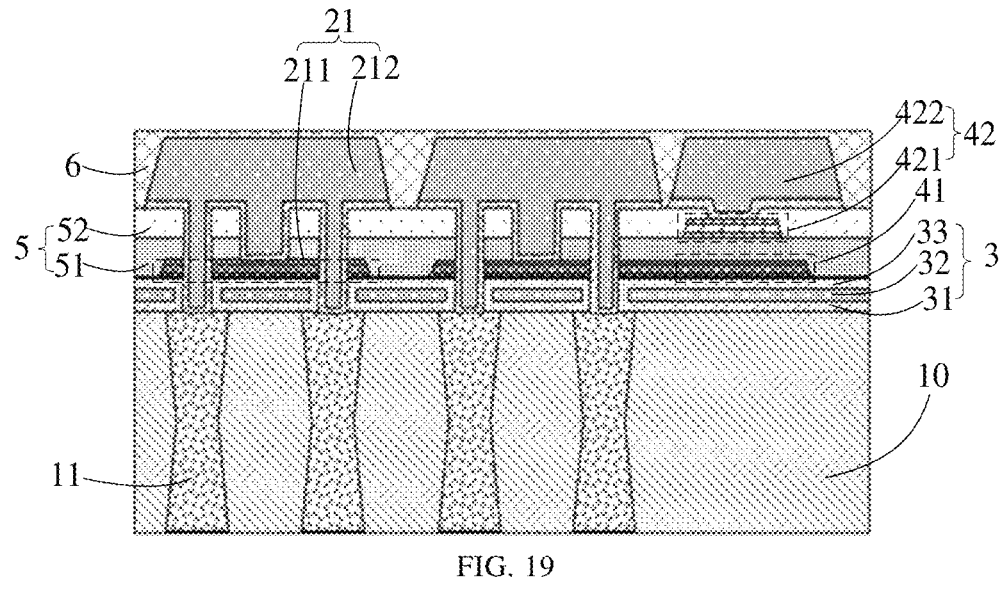
FIG. 19
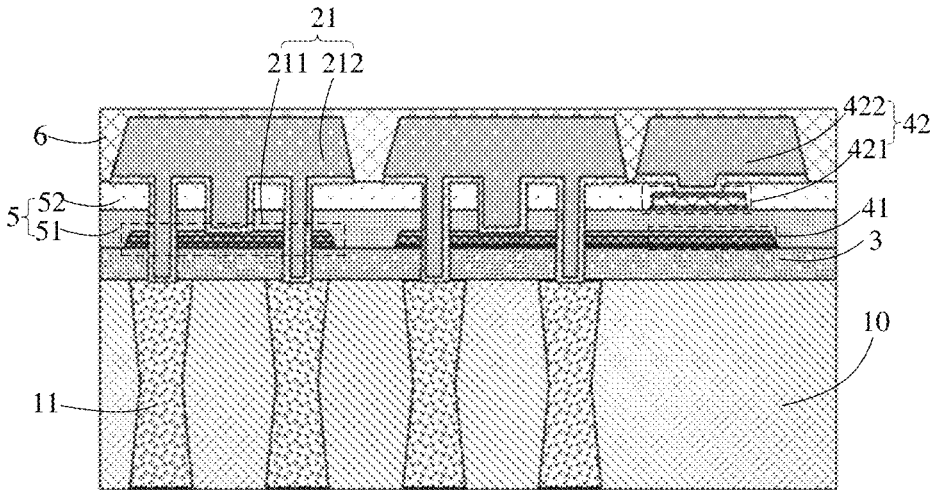
FIG. 20
FIG. 21

FILTER, MANUFACTURING METHOD THEREOF AND ELECTRONIC APPARATUS

This is a National Phase Application filed under 35 U.S.C. 371 as a national stage of PCT/CN2022/115408, filed Aug. 29, 2022, the content of which is hereby incorporated by reference in its entirety.

TECHNICAL FIELD

The present disclosure relates to the field of passive device technology, and in particular to a filter, a method for manufacturing a filter and an electronic apparatus.

BACKGROUND

Nowadays, the consumer electronics industry changes with each passing day, mobile communication terminals represented by mobile phones, particularly 5G mobile phones, are developing rapidly, the more and more frequency bands of signals are processed by the mobile phones, the required radio frequency chips are more and more, and the mobile phones are developing continuously towards a form enjoyed by consumers, including miniaturization, lightness and thinness and long battery life. In a traditional mobile phone, a large number of discrete devices, such as resistors, capacitors, inductors, filters and the like, are provided on a radio frequency PCB, and the discrete devices have the defects of large volume, high power consumption, multiple welding spots and large parasitic parameter change, and thus are difficult to meet future requirements. The interconnection, matching or the like among the radio frequency chips are required to be implemented by integrated passive devices with small area, high performance and good consistency. The integrated passive devices currently on the market are mainly Si (silicon) based substrates and GaAs (gallium arsenide) based substrates. The Si-based integrated passive device has the advantages of low price, but has a high microwave loss due to the fact that Si has trace impurities (poor insulation). Thus, the Si-based integrated passive device has the general performance. The GaAs-based integrated passive device has the excellent performance, but is expensive.

SUMMARY

The present disclosure is directed to at least one of the technical problems of the prior art, and provides a filter, a method for manufacturing a filter and an electronic apparatus.

An embodiment of the present disclosure provides a filter, including a dielectric substrate, and at least one inductor and at least one capacitor integrated on the dielectric substrate; the dielectric substrate includes first connection vias penetrating through the dielectric substrate in a thickness direction of the dielectric substrate, and includes a first surface and a second surface opposite to each other in the thickness direction of the dielectric substrate; and each inductor includes first conductive structures on the first surface, second conductive structures on the second surface, and first connection electrodes in the first connection vias; the first conductive structures form a coil structure of the inductor with the second conductive structures through the first connection electrodes; the filter further includes a buffer layer between the first conductive structures and the first surface, and each first conductive structure is electrically connected to the first connection electrode through a second connection via penetrating through the buffer layer.

In some embodiments, the buffer layer includes a first film layer, a second film layer, and a third film layer sequentially disposed along a direction of the first surface away from the second surface, the second film layer includes first openings therein corresponding to the first connection vias, and an orthographic projection of each first connection via on a plane of the first surface is within an orthographic projection of the corresponding first opening on the plane of the first surface.

In some embodiments, the second film layer is made of a resin.

In some embodiments, the buffer layer is a single-layer structure, and is made of a resin.

In some embodiments, each first conductive structure includes a first sub-structure and a second sub-structure arranged sequentially along a direction of the first surface away from the second surface, and the filter further includes a first interlayer insulating layer between the first sub-structure and the second sub-structure; and the first sub-structure is electrically connected to the first connection electrode through the corresponding second connection via, and the second sub-structure is electrically connected to the first sub-structure through a corresponding one of third connection vias penetrating through the first interlayer insulating layer.

In some embodiments, the third connection vias correspond to the second connection vias, respectively, and an orthographic projection of each third connection via on the plane of the first surface is within an orthographic projection of the corresponding first connection via on the plane of the first surface.

In some embodiments, each first conductive structure includes a first sub-structure and a second sub-structure arranged sequentially along a direction of the first surface away from the second surface, and the filter further includes a first interlayer insulating layer between the first sub-structure and the second sub-structure; and the first sub-structure is insulated from the corresponding first connection electrode by the buffer layer, and the second sub-structure is electrically connected to the first sub-structure through a corresponding one of third connection vias penetrating through the first interlayer insulating layer, and is electrically connected to the first connection electrode through the corresponding third connection vias and the corresponding second connection via; and the third connection vias correspond to the first connection vias, respectively, and penetrate through the first interlayer insulating layer and the first sub-structure.

In some embodiments, each capacitor includes a first plate and a second plate disposed sequentially along the direction of the first surface away from the second surface; and the first plate and the first sub-structure are in the same layer.

In some embodiments, the first interlayer insulating layer includes a first insulating layer and a second insulating layer disposed sequentially along the direction of the first surface away from the second surface; and the second plate is on a side of the first insulating layer away from the dielectric substrate.

In some embodiments, the second plate includes a first sub-plate and a second sub-plate sequentially arranged along the direction of the first surface away from the second surface, the second sub-plate and the second sub-structure are in the same layer, and the second sub-plate is electrically connected to the first sub-plate through a fourth connection via penetrating through the second insulating layer.

In some embodiments, the filter further includes a first protective layer and a first planarization layer sequentially disposed on a side of the second sub-structure and the second sub-plate away from the dielectric substrate, a first connection pad electrically connected to the corresponding second sub-structure through a fifth connection via, and a second connection pad electrically connected to the corresponding second sub-plate through a sixth connection via; and the fifth connection via and the sixth connection via penetrate through the first protective layer and the first planarization layer.

In some embodiments, the filter further includes a second protective layer and a second planarization layer disposed sequentially on a side of the second conductive structure away from the dielectric substrate.

An embodiment of the present disclosure provides a method for manufacturing a filter, which includes: integrating at least one inductor and at least one capacitor on a dielectric substrate; forming each inductor includes: providing the dielectric substrate such that the dielectric substrate includes first connection vias penetrating through the dielectric substrate in a thickness direction of the dielectric substrate, and includes a first surface and a second surface opposite to each other in the thickness direction of the dielectric substrate; forming a first connection electrode in each first connection via; forming a buffer layer on the first surface, and second connection vias penetrating through the buffer layer; forming first conductive structures on a side of the buffer layer away from the dielectric substrate such that each first conductive structure is electrically connected to the first connection electrode through the corresponding second connection via; and forming second conductive structures on the second surface, and the second conductive structures are electrically connected to the first conductive structures through the first connection electrodes to form a coil structure of the inductor.

In some embodiments, the forming the buffer layer on the first surface and the second connection vias penetrating through the buffer layer includes: sequentially forming a first film layer and a second film layer on the first surface, and forming first openings penetrating through the second film layer; and forming a third film layer on a side of the second film layer away from the first film layer, and forming the second connection vias penetrating through the first film layer, the second film layer and the third film layer; the first openings and the first connection vias are correspondingly arranged, and an orthographic projection of each first connection via on a plane of the first surface is within an orthographic projection of the corresponding first opening on the plane of the first surface.

In some embodiments, the second film layer is made of a resin.

In some embodiments, the buffer layer is a single-layer structure, and is made of a resin.

In some embodiments, the forming the first conductive structures on a side of the buffer layer away from the dielectric substrate includes: forming a first sub-structure of each first conductive structure on a side of the buffer layer away from the dielectric substrate such that the first sub-structure is electrically connected to the first connection electrode through the corresponding second connection via; forming a first interlayer insulating layer on a side of the first sub-structure away from the dielectric substrate, and forming third connection vias penetrating through the first interlayer insulating layer; and forming a second sub-structure of each first conductive structure on a side of the first interlayer insulating layer away from the dielectric substrate such that the second sub-structure is electrically connected to the first sub-structure through the corresponding third connection via to form the first conductive structure.

In some embodiments, the forming the first conductive structures on the side of the buffer layer away from the dielectric substrate includes: forming a first sub-structure of each first conductive structure on a side of the buffer layer away from the dielectric substrate such that the first sub-structure is insulated from the corresponding first connection electrode by the buffer layer; forming a first interlayer insulating layer on a side of the first sub-structure away from the dielectric substrate, and forming third connection vias penetrating through the first interlayer insulating layer such that the third connection vias are arranged corresponding to the first connection vias, respectively; and forming a second sub-structure of each first conductive structure on a side of the first interlayer insulating layer away from the dielectric substrate such that the second sub-structure is electrically connected to the first sub-structure through the corresponding third connection via to form the first conductive structure, and the second sub-structure is electrically connected to the first connection electrode through the corresponding second connection via and the corresponding third connection via.

In some embodiments, a first plate of each capacitor is formed at the same time as the first sub-structure is formed.

In some embodiments, the forming the first interlayer insulating layer includes: sequentially forming a first insulating layer and a second insulating layer along a direction of the first surface away from the second surface; and a second plate of each capacitor is formed on a side of the first insulating layer away from the dielectric substrate.

In some embodiments, the forming the second plate includes: sequentially forming a first sub-plate and a second sub-plate along the direction of the first surface away from the second surface, wherein the second sub-plate and the second sub-structure are formed through a single patterning process, the first sub-plate is located between the first insulating layer and the second insulating layer, the second sub-plate and the second sub-structure are arranged in the same layer, and the second sub-plate is electrically connected to the first sub-plate through a fourth connection via penetrating through the second insulating layer.

In some embodiments, the method further includes: sequentially forming a first protective layer and a first planarization layer on a side of the second sub-structure and the second sub-plate away from the dielectric substrate, and forming a fifth connection via and a sixth connection via penetrating through the first protective layer and the first planarization layer; and forming a first connection pad and a second connection pad on a side of the first planarization layer away from the first protective layer; wherein the first connection pad is electrically connected to the corresponding second sub-structure through the fifth connection via, and the second connection pad is electrically connected to the corresponding second sub-plate through the sixth connection via.

In some embodiments, the method further includes: sequentially forming a second protective layer and a second planarization layer on a side of the second conductive structures away from the dielectric substrate.

An embodiment of the present disclosure provides an electronic apparatus, which includes the filter in any one of the above embodiments.

BRIEF DESCRIPTION OF DRAWINGS

FIG. 19 is a schematic diagram of an intermediate product formed at a step S28 of a method for manufacturing a filter according to a second example of an embodiment of the present disclosure.

FIG. 20 is a schematic diagram of an intermediate product formed at a step S34 of a method for manufacturing a filter according to a second example of an embodiment of the present disclosure.

FIG. 21 is a schematic diagram of an intermediate product formed at steps S44 and S45 of a method for manufacturing a filter according to a second example of an embodiment of the present disclosure.

DETAIL DESCRIPTION OF EMBODIMENTS

In order to enable one of ordinary skill in the art to better understand the technical solutions of the embodiments of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term "comprising", "including", or the like means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figures 1, 2:
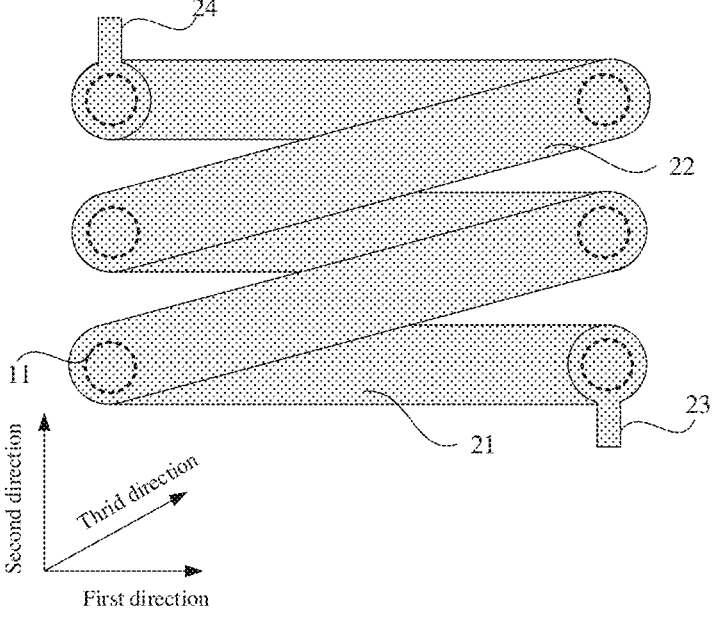
FIG. 1 is a top view of an inductor according to an embodiment of the present disclosure.
FIG. 2 is a circuit diagram of a filter.

FIG. 1 is a top view of an inductor according to an embodiment of the present disclosure. Referring to FIG. 1, the inductor includes first conductive structures 21 extending along a first direction and arranged side by side along a second direction; second conductive structures 22 extending in a third direction and arranged side by side in the second direction. The first direction, the second direction and the third direction are different from each other. In the embodiment of the present disclosure, as an example, the first direction and the second direction are perpendicular to each other, and the first direction and the third direction intersect with each other and are non-perpendicular to each other for description. Alternatively, the extending directions of the first conductive structures 21 and the second conductive structures 22 may be interchanged with each other, which is also within the protection scope of the embodiments of the present disclosure. In addition, in the present embodiment, as an example, the inductor includes N first conductive structures 21 and N−1 second conductive structures 22 for description, where N≥2, and N is an integer. Orthographic projections of a first terminal and a second terminal of each first conductive structure 21 on a first dielectric substrate at least partially overlap with orthographic projections of two first connection vias on the first dielectric substrate, respectively. The first terminal and the second terminal of each first conductive structure 21 correspond to two different first connection vias. That is, an orthographic projection of each first conductive structure 21 on the first dielectric substrate at least partially overlap with the orthographic projections of two first connection vias on the first dielectric substrate. At this time, the ith second conductive structure 22 of the inductor is connected to the first terminal of the ith first conductive structure 21 and the second terminal of the (i+1)th first conductive structure 21 through first connection electrodes 11 in the first connection vias to form an inductor coil, where 1≤i≤N−1, and i is an integer.

It should be noted that a first lead terminal 23 is connected to a second terminal of the 1st first conductive structure 21 of the inductor coil, and a second lead terminal 24 is connected to a first terminal of the Nth first conductive structure 21. Further, the first lead terminal 23 and the second lead terminal 24 may be disposed in the same layer and made of the same material as the second conductive structures 22. At this time, the first lead terminal 23 may be connected to the second terminal of the 1st first conductive structure 21 through a first connection electrode 11, and correspondingly, the second lead terminal 24 may be connected to the first terminal of the Nth first conductive structure 21 through a first connection electrode 11.

FIG. 2 is a circuit diagram of a filter. As shown in FIG. 2, a circuit of the filter includes two inductors, one capacitor and one resistor. For convenience of understanding, the two inductors are referred to as a first inductor L1 and a second inductor L2, respectively. With continued reference to FIG. 2, a first lead terminal of the first inductor L1 is connected to a first terminal of the resistor R, a second lead terminal of the first inductor L1 is connected to a second plate of the capacitor C, a first lead terminal of the second inductor L2 is connected to a second terminal of the resistor R, and a second lead terminal of the second inductor L2 is connected to a first plate of the capacitor C.

It should be noted that the resistor R may be implemented by a wire, or a high-resistance material, such as indium tin oxide (ITO) or nickel chromium (NiCr) alloy. In the embodiment of the present disclosure, the material of the resistor R is not limited. The capacitor and the inductors will be mainly described below.

As shown in FIGS. 3 to 6, an embodiment of the present disclosure provides a filter, which includes a dielectric substrate 10, and at least one inductor and at least one capacitor integrated on the dielectric substrate 10. The dielectric substrate 10 is provided with first connection vias penetrating through the dielectric substrate 10 in a thickness direction of the dielectric substrate 10, and the dielectric substrate 10 includes a first surface and a second surface oppositely arranged in the thickness direction of the dielectric substrate 10. Each inductor includes first conductive structures 21 disposed on the first surface, second conductive structures 22 disposed on the second surface, and first connection electrodes 11 disposed in the first connection vias. The first conductive structures 21 form a coil structure of the inductor with the second conductive structures 22 through the first connection electrodes 11. In particular, a buffer layer 3 is provided between the first conductive structures 21 of the filter and the first surface in the embodiment of the present disclosure, and each first conductive structure 21 is electrically connected to the first connection electrode 11 in connection vias penetrating through the buffer layer 3.

The buffer layer 3 is disposed between the first conductive structures 21 and the first surface in the embodiment of the present disclosure, so that the dielectric substrate 10 can be effectively prevented from expanding under a high temperature condition when forming subsequent film layers after the first conductive structures 21 are formed, and further the connection between the first connection electrode 11 in the first connection via of the dielectric substrate 10 and the first conductive structure 21 can be prevented from being affected.

Figure 3:
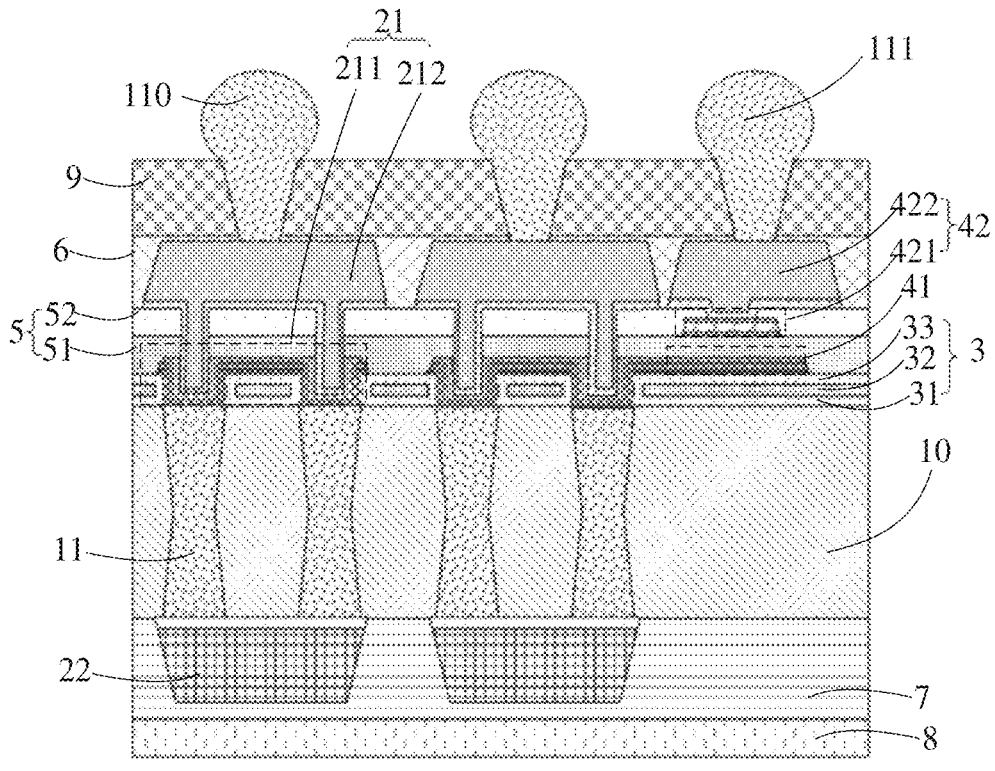
FIG. 3 is a cross-sectional view of a first filter according to an embodiment of the present disclosure.
Figure 4:
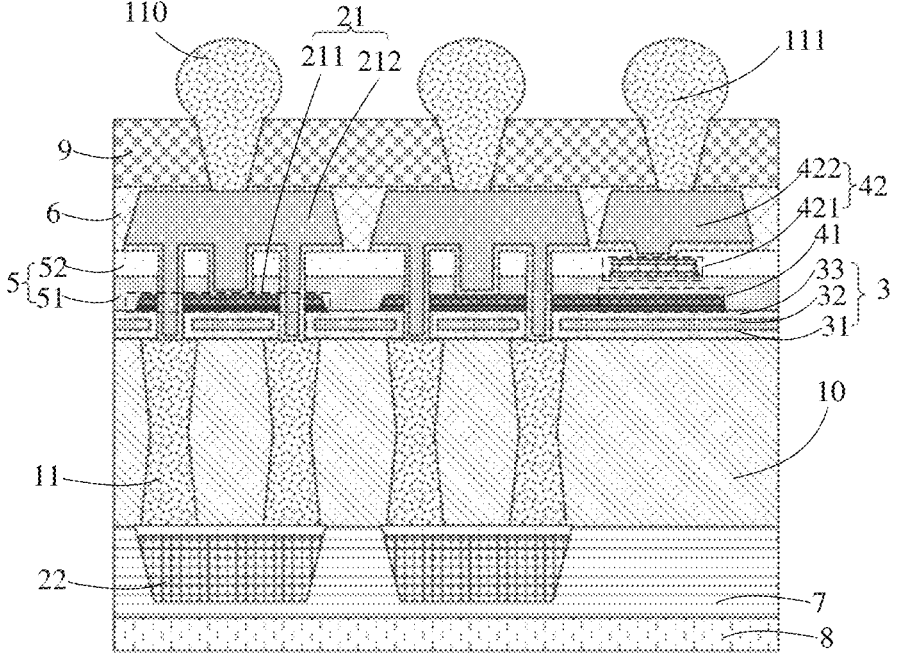
FIG. 4 is a cross-sectional view of a second filter according to an embodiment of the present disclosure.

In some examples, as shown in FIGS. 3 and 4, the buffer layer 3 includes a first film layer 31, a second film layer 32, and a third film layer 33 sequentially disposed along a direction of the first surface of the dielectric substrate 10 away from the second surface, the second film layer 32 is provided with first openings 321 therein, the first openings 321 are disposed corresponding to the first connection vias, and an orthographic projection of each first connection via on a plane of the first surface (a plane where the first surface is located) is located in an orthographic projection of the corresponding first opening 321 on the plane of the first surface. That is, the second film layer 32 is wrapped by the first film layer 31 and the third film layer 33. The first film layer 31 and the third film layer 33 may be made of the same material, for example, silicon nitride. The second film layer 32 may be made of resin material, for example, DL-1000C. In this case, the dielectric substrate 10 can be prevented from expanding under a high temperature condition when forming subsequent film layers after the first conductive structures 21 are formed, and further the connection between the first connection electrode 11 in the first connection via of the dielectric substrate 10 and the first conductive structure 21 can be prevented from being affected. The adhesion of the first conductive structures 21 to the dielectric substrate 10 can be enhanced.

Further, thicknesses of the first film layer 31 and the third film layer 33 may be the same or substantially the same, and in a range from about 120 nm to 200 nm, and a thickness of the second film layer 32 is in a range from about 2 μm to 5 μm. Each first opening 321 penetrating through the second film layer 32 has an opening diameter in a range from about 30 μm to 60 μm.

Figure 5:
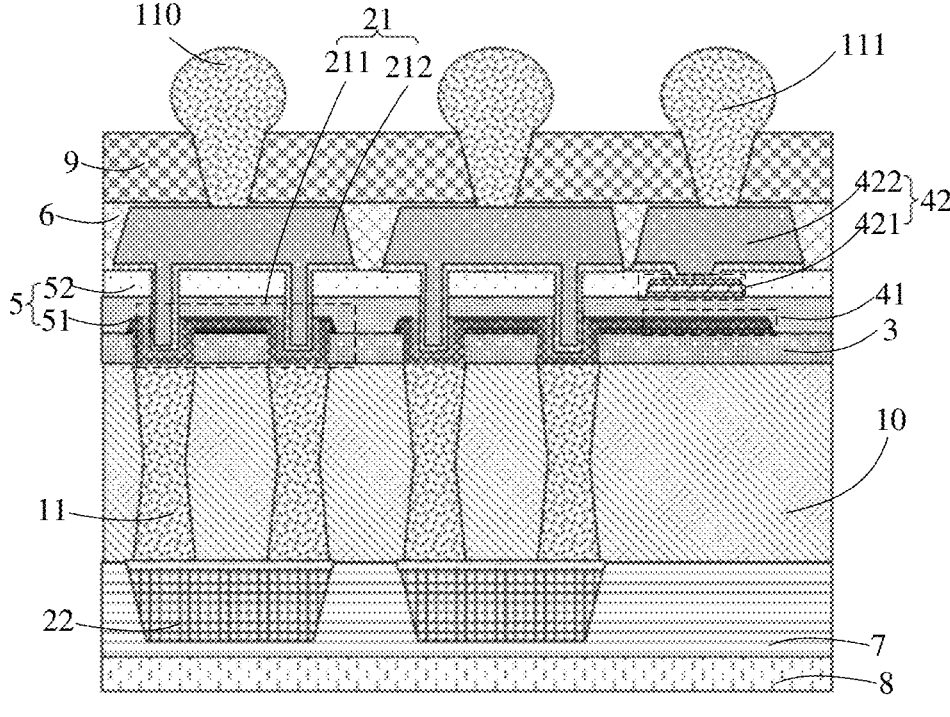
FIG. 5 is a cross-sectional view of a third filter according to an embodiment of the present disclosure.
Figure 6:
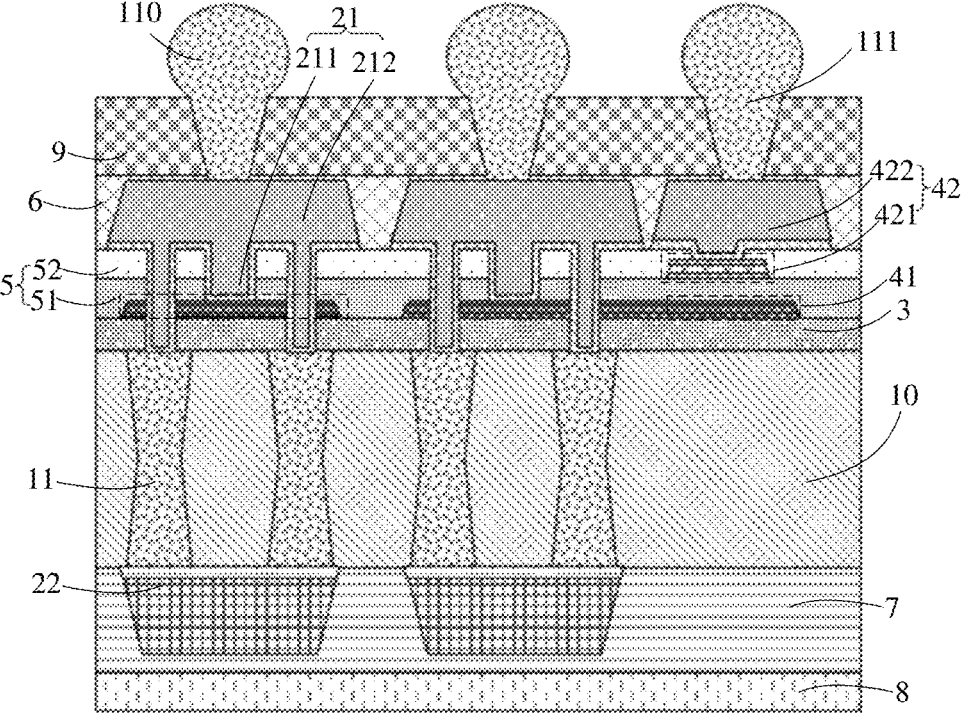
FIG. 6 is a cross-sectional view of a fourth filter according to an embodiment of the present disclosure.
Figure 7:
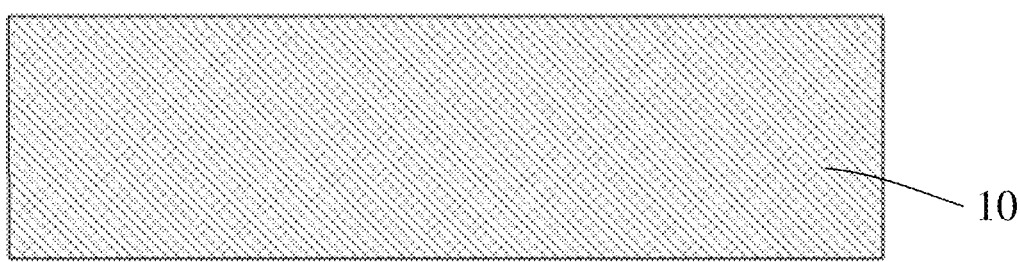
FIG. 7 is a schematic diagram of an intermediate product formed at a step S11 of a method for manufacturing a filter according to a first example of the embodiment of the present disclosure.

In some examples, as shown in FIGS. 5 and 6, the buffer layer 3 may alternatively be a single-layer structure, and may be made of a resin material, such as: BL-301. A thickness of the buffer layer 3 in this case is in a range from about 2 μm to 5 μm.

In some examples, each first conductive structure 21 in the filter may include a first sub-structure 211 and a second sub-structure 212 arranged sequentially along a direction of the buffer layer 3 away from the dielectric substrate 10, and a first interlayer insulating layer 5 is arranged between the first sub-structure 211 and the second sub-structure 212. The second sub-structure 212 is electrically connected to the first sub-structure 211 through a third connection via penetrating through the first interlayer insulating layer 5. In one example, as shown in FIGS. 3 and 5, the first sub-structure 211 is electrically connected to the first connection electrode 11 through the corresponding second connection via penetrating through the buffer layer 3. In another example, as shown in FIGS. 4 and 6, the first sub-structure 211 is insulated from the corresponding first connection electrode 11 by the buffer layer 3, and the second sub-structure 212 is electrically connected to the corresponding first connection electrode 11 through the third connection via penetrating through the first sub-structure 211 and the first interlayer insulating layer 5.

Further, the first sub-structure 211 may include a first portion 2111, a second portion 2112 and a third portion 2113 arranged sequentially along the direction of the buffer layer 3 away from the dielectric substrate 10. The first portion 2111 may be a molybdenum (Mo) and nickel (Ni) alloy layer with a thickness in a range from about 0.03 μm to 0.05 μm, the second portion 2112 may be a copper (Cu) layer with a thickness in a range from about 0.3 μm to 0.5 μm, and the third portion 2113 may be a Mo and Ni alloy layer with a thickness in a range from about 0.02 μm to 0.05 μm.

In some examples, each capacitor includes a first plate 41 and a second plate 42 sequentially disposed along the direction of the buffer layer 3 away from the dielectric substrate 10. The first plate 41 of the capacitor may be disposed in the same layer and made of the same material as the first sub-structure 211. That is, the first plate 41 of the capacitor and the first sub-structure 211 may be formed through a single patterning process.

When the first sub-structure 211 of each first conductive structure 21 includes the first portion 2111, the second portion 2112 and the third portion 2113, the first plate 41 of the capacitor includes a fourth portion 411, a fifth portion 412 and a sixth portion 413 sequentially arranged along the direction of the buffer layer 3 away from the dielectric substrate 10. The fourth portion 411 is disposed in the same layer and made of the same material as the first portion 2111, the fifth portion 412 is disposed in the same layer and made of the same material as the second portion 2112, and the sixth portion 413 is disposed in the same layer and made of the same material as the third portion 2113.

Further, the first interlayer insulating layer 5 may include a first insulating layer 51 and a second insulating layer 52 sequentially disposed along the direction of the buffer layer 3 away from the dielectric substrate 10. The first insulating layer 51 is used as a dielectric layer of the capacitor, and the second plate 42 is disposed on a side of the first insulating layer 51 away from the dielectric substrate 10. A material of each of the first insulating layer 51 and the second insulating layer 52 is an inorganic insulating material. For example: each of the first insulating layer 51 and the second insulating layer 52 is an inorganic insulating layer formed of silicon nitride (SiNx), or an inorganic insulating layer formed of silicon oxide ($SiO_2$), or a film layer formed by combining several stacked layers of the inorganic insulating layer of SiNx and the inorganic insulating layer of $SiO_2$.

Further, the second plate 42 of each capacitor may include a first sub-plate 421 and a second sub-plate 422 sequentially disposed along the direction of the buffer layer 3 away from the dielectric substrate 10. The second sub-plate 422 may be disposed in the same layer as the second sub-structure 212, the first sub-plate 421 is disposed on a side of the second insulating layer 52 close to the first insulating layer 51, and the second sub-plate 422 is electrically connected to the first sub-plate 421 through a fourth connection via penetrating through the second insulating layer 52.

In some examples, on the basis of the above filter, the filter of the embodiments of the present disclosure further includes: a first protective layer 6 and a first planarization layer 9 arranged sequentially on a side of a layer, where the second sub-structure 212 of each first conductive structure 21 and the second sub-plate 422 of the second plate 42 of each capacitor are located, away from the dielectric substrate 10, and first connection pads 110 and second connection pads 111 arranged on a side of the first planarization layer 9 away from the dielectric substrate 10. Each first connection pad 110 is electrically connected to the corresponding second sub-structure 212 through a fifth connection via penetrating through the first protective layer 6 and the first planarization layer 9, and each second connection pad 111 is electrically connected to the corresponding second sub-plate 422 through a sixth connection via penetrating through the first protective layer 6 and the first planarization layer 9.

Further, the first connection pads 110 and the second connection pads 111 may be solder balls. The first protective layer 6 is used for preventing water and oxygen from corroding devices formed on the first surface of the dielectric substrate 10. A thickness of the first protective layer 6 is in a range from 0.4 μm to 0.6 μm; the first protective layer 6 may be made of an inorganic insulating material. For example: the first protective layer 6 may be an inorganic insulating layer formed of silicon nitride (SiNx), or an inorganic insulating layer formed of silicon oxide ($SiO_2$), or a film layer formed by combining several stacked layers of the inorganic insulating layer of SiNx and the inorganic insulating layer of $SiO_2$. A material of the first planarization layer 9 may include an organic insulating material including, for example, resin-based materials such as polyimide, epoxy, acryl, polyester, photoresist, polyacrylate, polyamide, siloxane, or the like. As another example, the organic insulating material includes an elastic material, such as urethane, Thermoplastic Polyurethane (TPU), or the like.

In some examples, the filter includes not only the above structures, but also a second protective layer 7 and a second planarization layer 8 arranged sequentially on a side of the second conductive structures 22 away from the dielectric substrate 10.

The second protective layer 7 is used for preventing water and oxygen from corroding devices formed on the second surface of the dielectric substrate 10. A thickness of the second protective layer 7 is in a range from 0.4 μm to 0.6 μm; the second protective layer 7 may be made of an inorganic insulating material. For example: the second protective layer 7 may be an inorganic insulating layer formed of silicon nitride (SiNx), or an inorganic insulating layer formed of silicon oxide ($SiO_2$), or a film layer formed by combining several stacked layers of the inorganic insulating layer of SiNx and the inorganic insulating layer of $SiO_2$. A material of the second planarization layer 8 may include an organic insulating material including, for example, resin-based materials such as polyimide, epoxy, acryl, polyester, photoresist, polyacrylate, polyamide, siloxane, or the like. As another example, the organic insulating material includes an elastic material, such as urethane, Thermoplastic Polyurethane (TPU), or the like.

The embodiment of the present disclosure provides a method for manufacturing a filter, which is used for manufacturing the filters in any one of the embodiments. The method specifically includes: integrating at least one inductor and at least one capacitor on a dielectric substrate 10; wherein the forming each inductor includes following steps.

A dielectric substrate 10 is provided; the dielectric substrate 10 is provided with first connection vias penetrating through the dielectric substrate 10 in a thickness direction of the dielectric substrate 10, and the dielectric substrate 10 includes a first surface and a second surface oppositely arranged along the thickness direction of the dielectric substrate 10.

A first connection electrode 11 is formed in each first connection via.

A buffer layer 3 on the first surface is formed, and second connection vias penetrating through the buffer layer 3 are formed.

First conductive structures 21 are formed on a side of the buffer layer 3 away from the dielectric substrate 10, and each first conductive structure 21 is electrically connected to the first connection electrode 11 through the corresponding second connection via.

Second conductive structures 22 are formed on the second surface, wherein the second conductive structures 22 are electrically connected to the first conductive structures 21 through the first connection electrodes 11 to form a coil structure of the inductor.

In the manufacturing method of the embodiment of the present disclosure, the buffer layer 3 is disposed between the first conductive structures 21 and the first surface in the embodiment of the present disclosure, so that the dielectric substrate 10 can be effectively prevented from expanding under a high temperature condition when forming subsequent film layers after forming the first conductive structures 21, and further the connection between the first connection electrode 11 in the first connection via of the dielectric substrate 10 and the first conductive structure 21 can be prevented from being affected.

In order to clearly understand the method for manufacturing a filter according to the embodiment of the present disclosure, the method for manufacturing the filter shown in FIGS. 3 to 6 is described below.

In a first example: a method for manufacturing the filter shown in FIG. 3 is provided, and may specifically include the following steps S11 to S110.

The step S11 includes providing a dielectric substrate 10; the dielectric substrate 10 includes a first surface and a second surface which are oppositely arranged along the thickness direction of the dielectric substrate.

The dielectric substrate 10 includes, but is not limited to, the glass substrate. In some examples, a thickness of the dielectric substrate 10 is in a range from about 0.25 mm to about 0.3 mm, which is suitable for the first dielectric substrate 10 with a small size.

The step S12 includes forming the first connection vias penetrating through the dielectric substrate 10 along the thickness direction of the dielectric substrate 10.

In some examples, a via-last process may be performed on the dielectric substrate 10 for forming the first connection vias 11 by using various methods, including, for example: a sand blast method, a photosensitive glass method, a focus discharge method, a plasma etching method, a laser ablation method, an electrochemical method, a laser induced etching method, or the like. Different methods have different advantages and disadvantages, and application scenarios. For example, the sand blast method is a simple process, and the first connection via formed by this method has a larger aperture, so that this method is only suitable for forming the first connection via with the aperture larger than 200 μm. The photosensitive glass method is a simple process and capable of forming the first connection vias with high density and high aspect ratio. The focus discharge method can form the first connection via rapidly. The first connection via formed by the plasma etching method has a small sidewall roughness. The laser ablation method can form the first connection vias with high density and high aspect ratio, but with a high roughness. The electrochemical method is low in cost, is performed by simple devices, and can form the first connection via rapidly and can form the first connection via with a larger diameter. The laser induced etching method can form the first connection via rapidly, can form the first connection vias with high density and high aspect ratio, and will not damage inside of the first connection via, but with a disadvantage of an expensive laser device. Taking the laser induced etching method as an example, the via-last process may be performed on the back side of the first dielectric substrate 10 by using the laser induced etching method. First, a laser-induced modification is performed on positions where the first connection vias are to be formed by laser, and then the vias are formed by using a wet etching process. The via-last process may be performed only by adopting a single-side etching process, so that each formed via can only be an inverted cone-shaped via, and for the laser induced etching method, the inverted cone-shaped via formed by adopting the single-side etching process is typical characteristics of the first connection via formed on the back side of the first dielectric substrate 10 through the via-last process.

The step S13 includes forming the first connection electrode 11 in each first connection via.

In some examples, in the step S13, an auxiliary film layer is formed through a process including, but not limited to, a magnetron sputtering process, and then the first conductive film layer is continuously sputtered, the first conductive film layer is used as a first seed layer, the first seed layer is electroplated, and after the electroplating is completed, the excess electroplated copper on a second surface is removed by using a chemical mechanical polishing (CMP) method, thereby forming the first connection electrodes for filling the first connection vias 11.

The auxiliary film layer serves to increase the adhesion of the first conductive film layer. A material of the auxiliary film layer includes, but is not limited to, titanium Ti, and a material of the first conductive film layer includes, but is not limited to, Cu. A thickness of the auxiliary film layer is in a range from about 10 nm to about 300 nm, and a thickness of the first conductive film layer is in a range from about 30 nm to about 100 nm.

Figure 8:
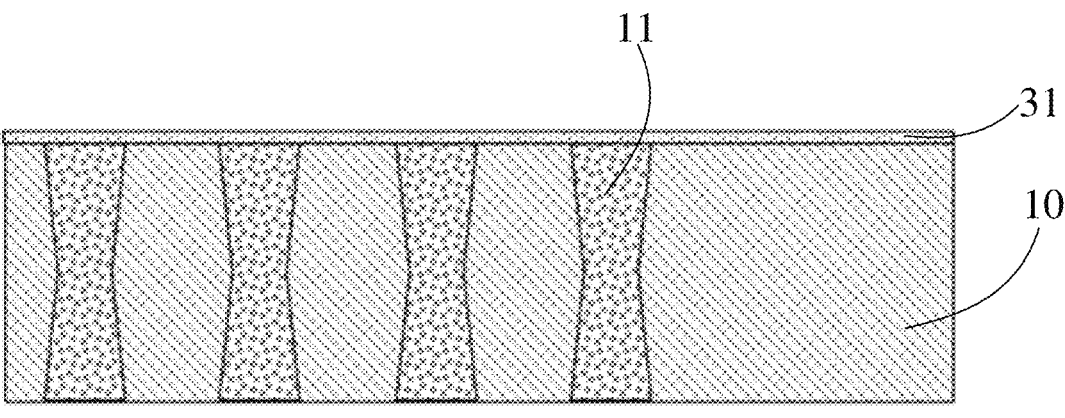
FIGS. 8 to 10 each are a schematic diagram of an intermediate product formed in a step S14 of a method for manufacturing a filter according to a first example of an embodiment of the present disclosure.
Figure 9:
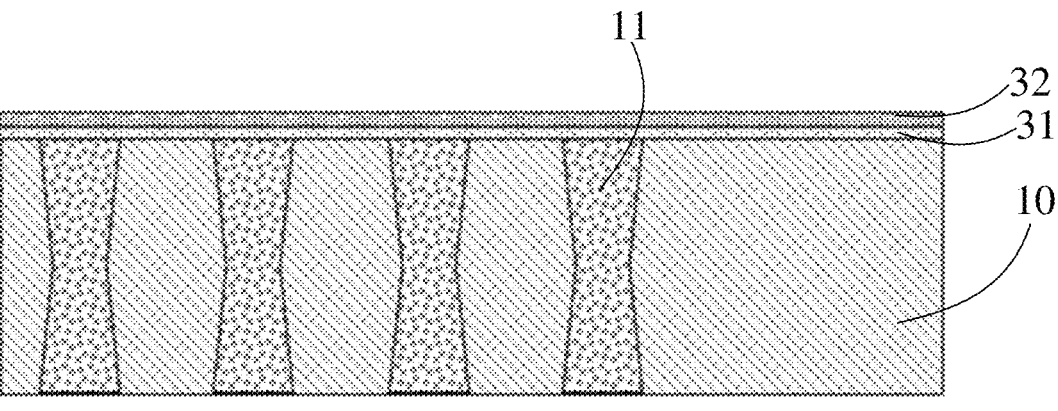
Figure 10:
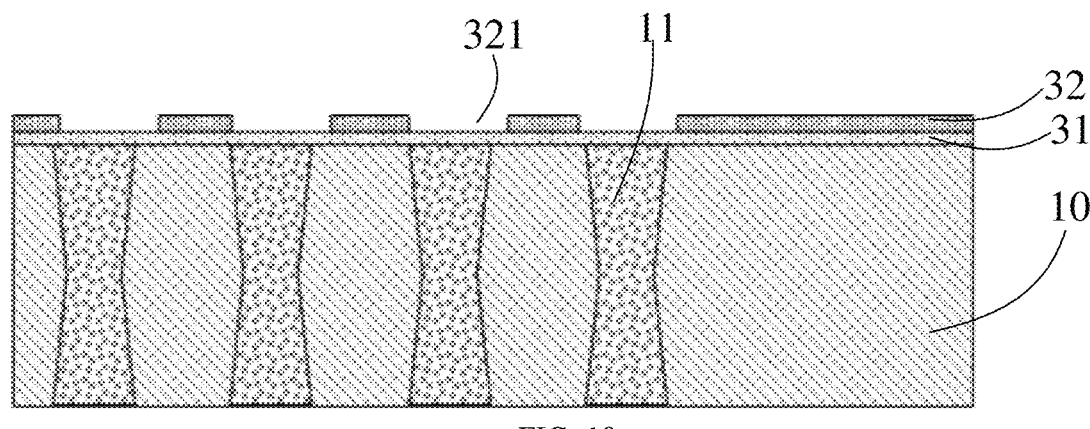

The step S14 includes sequentially forming the first film layer 31 and the second film layer 32 of the buffer layer 3 on the first surface of the dielectric substrate 10, and forming first openings 321 penetrating through the second film layer 32, as shown in FIGS. 8 to 10.

In some examples, the step S14 may include depositing the first film layer 31 on the entire surface by using a PECVD method, where a thickness of the first film layer 31 is in a range from about 120 nm to 200 nm, and the first film layer 31 may be made of silicon nitride (SiNx); and then coating the second film layer 32 by using a spin coating apparatus, where a thickness of the second film layer 32 is in a range from about 2 μm to 5 μm, and the second film layer 32 may be made of a resin material, such as DL-1000C; and exposing and developing portions of the second film layer 32 at positions corresponding to the first connection vias to obtain the first openings 321, wherein an opening diameter of each first opening 321 is in a range from 30 μm to 60 μm. It should be noted that the opening diameter of each first opening 321 is larger than an aperture of the corresponding first connection via.

Figure 11:
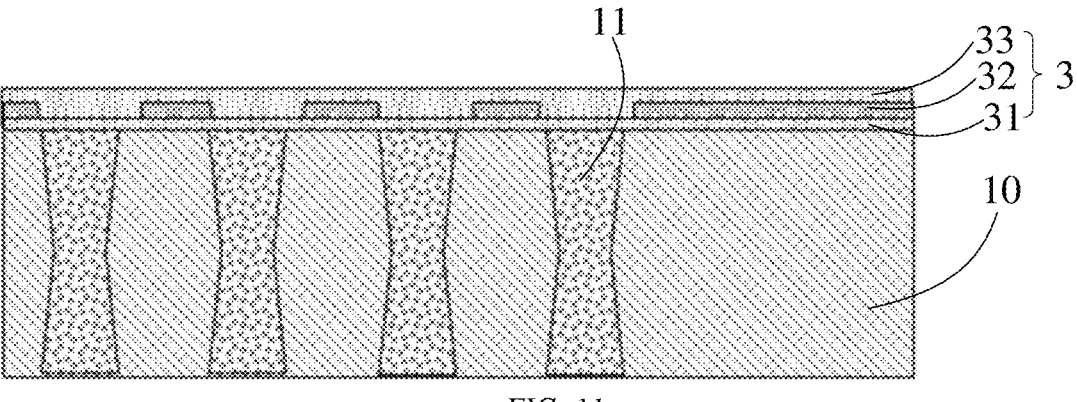
FIGS. 11 to 12 each are a schematic diagram of an intermediate product formed in a step S15 of a method for manufacturing a filter according to a first example of an embodiment of the present disclosure.
Figure 12:
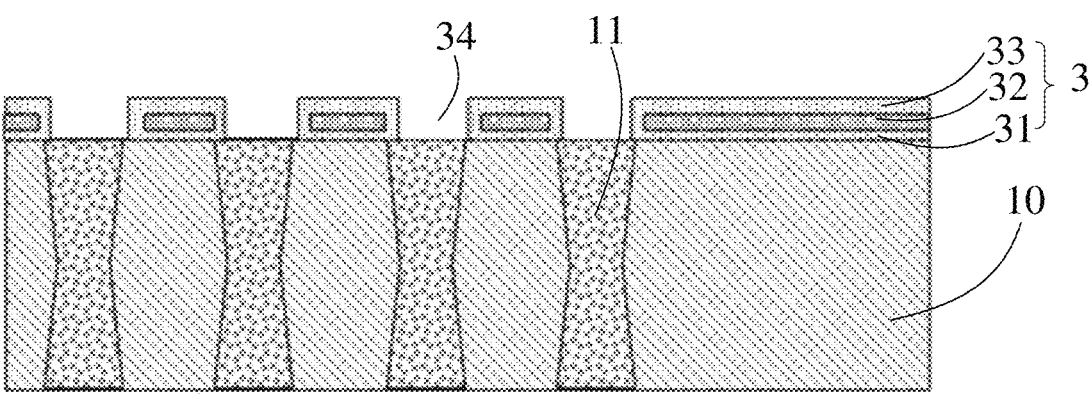

The step S15 includes forming a third film layer 33 on a side of the second film layer 32 away from the dielectric substrate 10, and forming second connection vias 34 penetrating through the first film layer 31 and the third film layer 33, wherein each second connection via 34 is connected to (extends through) the corresponding first connection via, as shown in FIGS. 11 to 12.

In some examples, the step S15 may include depositing the second film layer 32 on the entire surface by using a PECVD method, where a thickness of the second film layer 32 is in a range from about 120 nm to 200 nm, the second film layer 32 may be made of silicon nitride (SiNx); and then performing patterning, exposure, development, and dry etching processes to form the second connection vias 34 and exposing the first connection vias. It should be noted here that the patterning of the first film layer 31 and the third film layer 33 involves the trepanning (overlapping or aligning) of the first openings 321 and the second connection vias 34, so the Mark alignment must be accurate when patterning the first film layer 31 and the third film layer 33, otherwise the trepanning cannot be formed. A diameter for the patterning of the first film layer 31 and the third film layer 33 is smaller than the opening diameter of each first opening 321, so as to ensure that the first film layer 31 and the third film layer 33 can fully wrap the second film layer 32, and enhance the adhesion of the buffer layer 3 to the first conductive structures 21 to be formed and the dielectric substrate 10.

Figure 13:
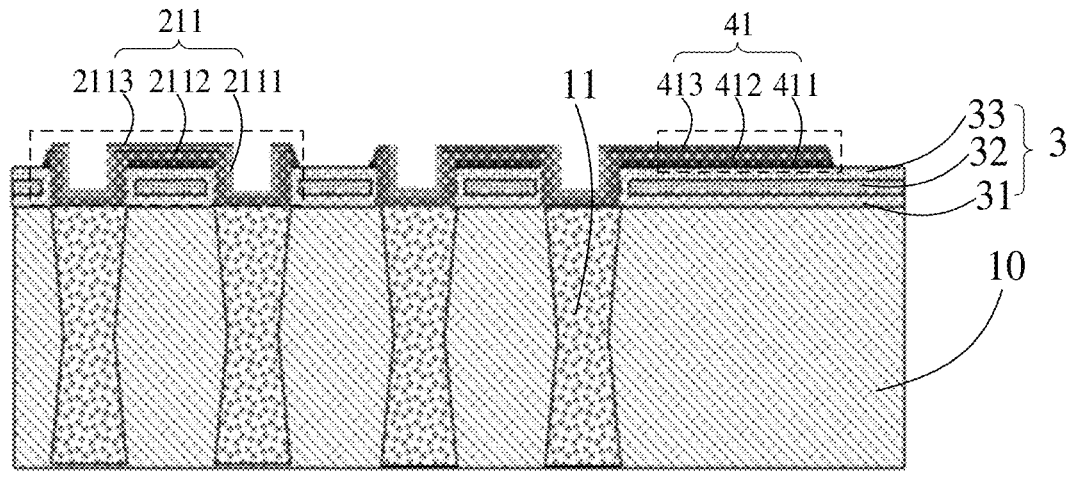
FIG. 13 is a schematic diagram of an intermediate product formed at a step S16 of a method for manufacturing a filter according to a first example of an embodiment of the present disclosure.

The step S16 includes forming the first sub-structure 211 of each first conductive structure 21 and the first plate 41 of each capacitor on a side of the third film layer 33 away from the dielectric substrate 10, wherein each first sub-structure 211 is electrically connected to the first connection electrode 11 through the corresponding second connection via 34, as shown in FIG. 13.

In some examples, the first sub-structure 211 includes a first portion 2111, a second portion 2112 and a third portion 2113, which are sequentially stacked on the first surface of the dielectric substrate 10; and the first plate 41 of the capacitor includes a fourth portion 411, a fifth portion 412, and a sixth portion 413, which are sequentially stacked on the first surface of the dielectric substrate 10. The first portions 2111 and the fourth portion 411 are disposed in the same layer and are made of the same material; the second portions 2112 and the fifth portion 412 are disposed in the same layer and are made of the same material; the third portions 2113 and the sixth portion 413 are disposed in the same layer and are made of the same material. Step S12 may specifically include the following steps.

In the above case, the step S16 may specifically include the following steps S161 to S162.

The step S161 includes sequentially depositing a first film, a second film and a third film on a side of the third film layer 33 away from the dielectric substrate 10 through a process including, but not limited to, a magnetron sputtering process; the first film may be a molybdenum (Mo) and nickel (Ni) alloy layer, and has a thickness in a range of about 0.03 µm to about 0.05 µm; the second film may be a copper (Cu) layer with a thickness in a range of about 0.3 µm to about 0.5 µm; the third film may be a Mo and Ni alloy layer, and has a thickness in a range of about 0.02 µm to about 0.05 µm.

The step S162 includes patterning the first, second and third films by a subtractive process to form the first sub-structure 211 of the first conductive structure 21 of the inductor including the first, second and third portions 2111, 2112, 2113 arranged in a stack, and the first plate 41 of the capacitor including the fourth, fifth and sixth portions 411, 412, 413 arranged in a stack. For example: a photoresist is spin-coated on a surface of the third film away from the dielectric substrate 10, is exposed by using a corresponding mask; the photoresist irradiated by ultraviolet light is modified, and the development process is performed on the modified photoresist for removing the modified photoresist, copper in the region which is not protected by the photoresist is etched away by using a copper etching solution to form the first sub-structure 211 of the inductor including the first, second and third portions 2111, 2112, 2113 arranged in a stack, and the first plate 41 of the capacitor including the fourth, fifth and sixth portions 411, 412, 413 arranged in a stack.

It should be noted that the layer where the first sub-structure 211 of the inductor and the first plate 41 of the capacitor are located is very critical in the whole device, and has the function for forming the plate of the capacitor, so that the requirement on flatness is high, and if the electroplated thick copper is used in the above steps, it is necessary to performs the chemical mechanical planarization on the electroplated thick copper. Another function is that the first sub-structures 211 act as connection structures for the connection among TGV (through glass via) vias (first connection vias) and the connection between the inductor and the capacitor. In order to ensure the reliability of conduction with the connection of the formed first connection electrodes 11 in the first connection vias, edges of the first sub-structures 211 exceeds edges of the first connection electrodes 11 in the first connection vias by 5 µm to 10 µm.

Figure 14:
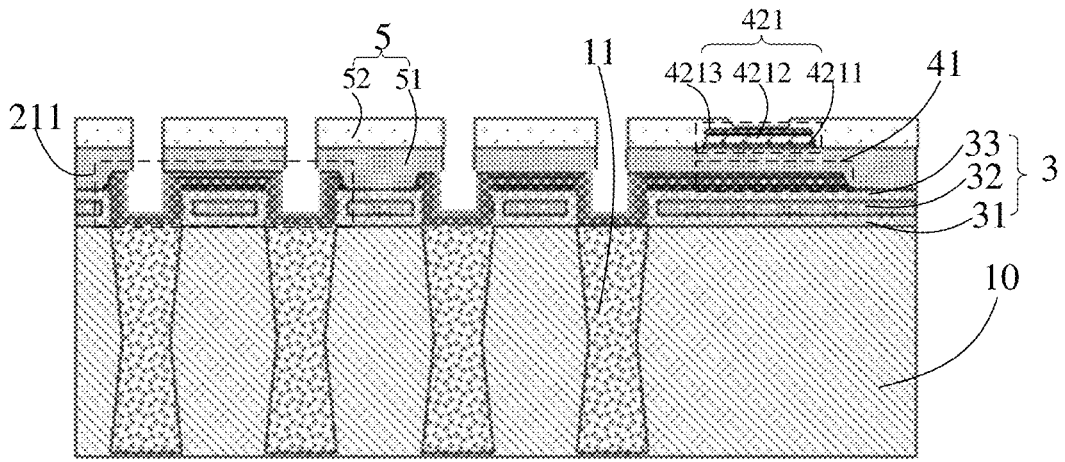
FIG. 14 is a schematic diagram of an intermediate product formed at a step S17 of a method for manufacturing a filter according to a first example of an embodiment of the present disclosure.

The step S17 includes forming a first insulating layer 51 of the first interlayer insulating layer 5 on a side of the first sub-structure 211 of each first conductive structure 21 and the first plate 41 of each capacitor away from the dielectric substrate 10, forming a first sub-plate 421 of each capacitor on a side of the first insulating layer 51 away from the dielectric substrate 10, forming a second insulating layer 52 of the first interlayer insulating layer 5, and finally forming third connection vias penetrating through the first insulating layer 51 and the second insulating layer 52 and fourth connection vias penetrating through the second insulating layer 52. Each third connection via is disposed corresponding to the first connection via, and the first sub-structure 211 and the second sub-structure 212 to be formed of each first conductive structure 21 are electrically connected to each other through the corresponding third connection via, and the first sub-plate 421 and the second sub-plate 422 to be formed of each capacitor are electrically connected to each other through the corresponding fourth connection via, as shown in FIG. 14.

In some examples, the first sub-plate 421 of the capacitor includes a seventh portion 4211, an eighth portion 4212, and a ninth portion 4213 stacked sequentially along a direction from the first insulating layer 51 away from the dielectric substrate 10, and step S13 may include the following steps.

In this case, the step S17 may include the following steps S171 to S173.

The step S171 includes forming a first insulating layer 51 on a side of the first sub-structures 211 of the inductor and the first plate 41 of the capacitor away from the dielectric substrate 10, by adopting standard depositing processes such as Plasma Enhanced Chemical Vapor Deposition (PECVD).

A material of the first insulating layer 51 is an inorganic insulating material. For example: the first insulating layer 51 is an inorganic insulating layer formed of silicon nitride (SiNx), or an inorganic insulating layer formed of silicon oxide (SiO$_2$), or a plurality of stacked composite film layers including the SiNx inorganic insulating layer and the SiO$_2$ inorganic insulating layer. Alternatively, the first interlayer dielectric layer 4 also serves as an interlayer dielectric layer of the capacitor. A thickness of the first interlayer dielectric layer 4 is about 120 nm.

The step S172 includes sequentially depositing a fourth film, a fifth film and a sixth film through a process including, but not limited to, a magnetron sputtering process; spin-coating photoresist on a surface of the sixth film away from the dielectric substrate 10; performing an exposure process with a corresponding mask such that the photoresist irradiated by ultraviolet light is modified; and performing a development process on the modified photoresist for removing the modified photoresist; and etching away copper in the region which is not protected by the photoresist by using a copper etching solution to form the first sub-plate 421 of the second plate 42 of the capacitor including the seventh, eighth and ninth portions 4211, 4212, 4213 arranged in a stack.

The fourth film may be a molybdenum (Mo) and nickel (Ni) alloy layer, and has a thickness in a range of about 0.03 µm to about 0.05 µm; the fifth film may be a copper (Cu) layer with a thickness in a range of about 0.3 µm to about 0.5 µm; the sixth film may be a Mo and Ni alloy layer, and has a thickness in a range of about 0.02 µm to about 0.05 µm.

The step S173 includes forming the second insulating layer 52 on a side of the first sub-plate 421 of the second plate 42 of the capacitor away from the dielectric substrate 10, by using a standard deposition process such as PECVD, and forming, by a dry etching process, third connection vias which penetrate through the first insulating layer 51 and the second insulating layer 52 and fourth connection vias which penetrate through the second insulating layer 52.

The second insulating layer 52 may be made of a material which is the same as that of the first insulating layer 51, and has a thickness in a range from 0.2 µm to 0.5 µm.

Figure 15:
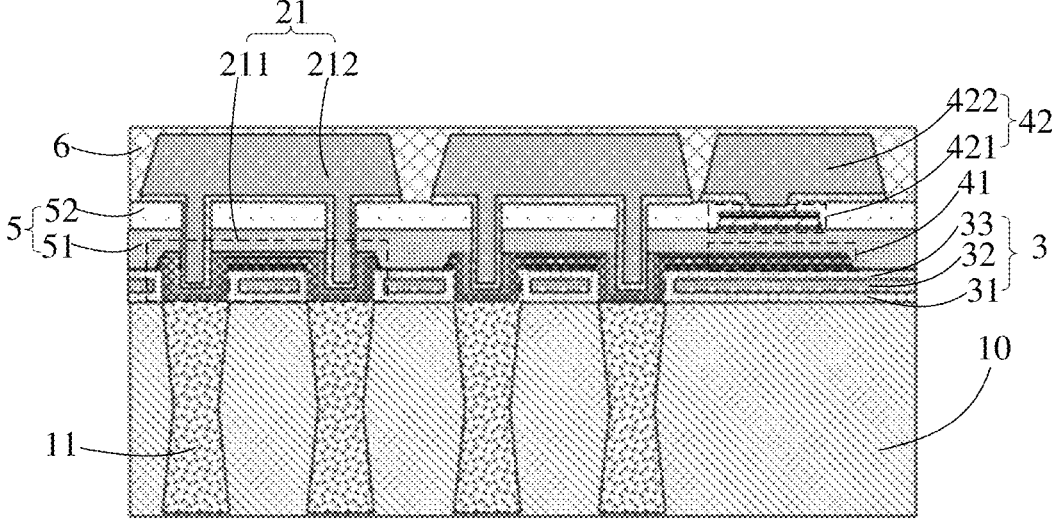
FIG. 15 is a schematic diagram of an intermediate product formed at a step S18 of a method for manufacturing a filter according to a first example of an embodiment of the present disclosure.

The step S18 includes forming the second sub-structure 212 of each first conductive structure 21 and the second sub-plate 422 of the second plate 42 on a side of the second insulating layer 52 away from the dielectric substrate 10, and forming a first protective layer 6 on a side of the second sub-structure 212 of each first conductive structure 21 and the second sub-plate 422 of the second plate 42 away from the dielectric substrate 10, as shown in FIG. 15.

In some examples, the step S18 may include sequentially forming a second conductive film and a third conductive film on a side of the second insulating layer 52 away from the dielectric substrate 10 through a process including, but not limited to, a magnetron sputtering process; performing an electroplating process on the third conductive film as a second seed layer, and patterning the third conductive film, which becomes thick due to the electroplating process, and the second conductive film to form the second sub-structure 212 of each first conductive structure 21 and the second sub-plate 422 of the second plate 42. Next, the first protective layer 6 is formed by depositing by using a standard process such as PECVD.

The third conductive film may be a molybdenum (Mo) and nickel (Ni) alloy layer with a thickness in a range from about 0.03 μm to 0.05 μm; the third conductive film may be a copper (Cu) layer with a thickness in a range from about 0.3 μm to 0.5 μm. The second conductive film is provided to increase the adhesion of the third conductive film.

The first protective layer 6 is used for preventing water and oxygen from corroding the device formed on the first surface of the dielectric substrate 10. A thickness of the first protective layer 6 is in a range from 0.4 μm to 0.6 μm; a material of the first protective layer 6 may be an inorganic insulating material. For example: the first protective layer 6 is an inorganic insulating layer formed of silicon nitride (SiNx), or an inorganic insulating layer formed of silicon oxide (SiO$_2$), or a composite film of a plurality of stacked layers including the SiNx inorganic insulating layer and the SiO$_2$ inorganic insulating layer.

Figure 16:
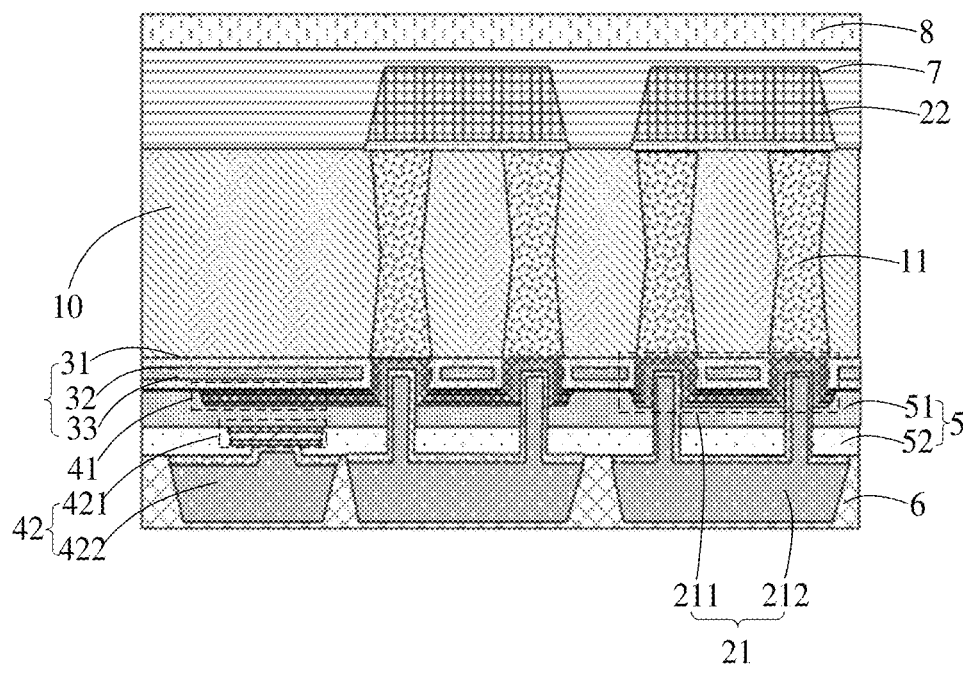
FIG. 16 is a schematic diagram of an intermediate product formed at a step S19 of a method for manufacturing a filter according to a first example of an embodiment of the present disclosure.

The step S19 includes turning over the dielectric substrate 10, and sequentially forming the second conductive structures 22 of the at least one inductor, a second protective layer 7 and a second planarization layer 8 on the second surface of the dielectric substrate 10, as shown in FIG. 16.

In some examples, the step S19 may specifically include the following steps S191 to S192.

The step S191 includes forming a fourth conductive film layer and a fifth conductive film layer on the second surface of the dielectric substrate 10 through a process including, but not limited to, a magnetron sputtering process; the fifth conductive film layer is used as a third seed layer; electroplating the third seed layer; wherein a thickness of the electroplated third seed layer is usually more than 5 microns; and then patterning the electroplated second seed layer, to form the second conductive structures 22 of the inductor.

The fifth conductive film may be a molybdenum (Mo) and nickel (Ni) alloy layer with a thickness in a range from about 0.03 μm to 0.05 μm; the fifth conductive film may be a copper (Cu) layer with a thickness in a range from about 0.3 μm to 0.5 μm. The fourth conductive film is disposed to increase an adhesion of the fifth conductive film.

The step S192 includes sequentially forming the second protective layer 7 and the second planarization layer 8 by adopting standard depositing processes such as PECVD or the like.

The second protective layer 7 is used for preventing water and oxygen from corroding the devices formed on the second surface of the dielectric substrate 10. A thickness of the second protective layer 7 is in a range from 0.4 μm to 0.6 μm; a material of the second protective layer 7 may be an inorganic insulating material. For example: the second protective layer 7 is an inorganic insulating layer formed of silicon nitride (SiNx), or an inorganic insulating layer formed of silicon oxide (SiO$_2$), or a plurality of stacked composite film layers including the SiNx inorganic insulating layer and the SiO$_2$ inorganic insulating layer.

A thickness of the second planarization layer 8 is 2 μm or more; a material of the second planarization layer 8 may include an organic insulating material including, for example, resin-based materials such as polyimide, epoxy, acryl, polyester, photoresist, polyacrylate, polyamide, siloxane, or the like. As another example, the organic insulating material includes an elastic material, such as urethane, Thermoplastic Polyurethane (TPU), or the like.

The step S110 includes turning over the dielectric substrate 10; forming the first planarization layer 9 on a side of the first protective layer 6 away from the dielectric substrate 10; forming a fifth connection via and a sixth connection via through etching, and forming the first connection pad 110 and the second connection pad 111 respectively at positions corresponding to the fifth connection via and the sixth connection via, as shown in FIG. 3.

A thickness of the first planarization layer 9 is 2 μm or more; a material of the first planarization layer 9 may include an organic insulating material including, for example, resin-based materials such as polyimide, epoxy, acryl, polyester, photoresist, polyacrylate, polyamide, siloxane, or the like. As another example, the organic insulating material includes an elastic material, such as urethane, Thermoplastic Polyurethane (TPU), or the like.

The first connection pad 110 and the second connection pad 111 may be solder.

Thus, the manufacturing of the filter is completed.

Figure 17:
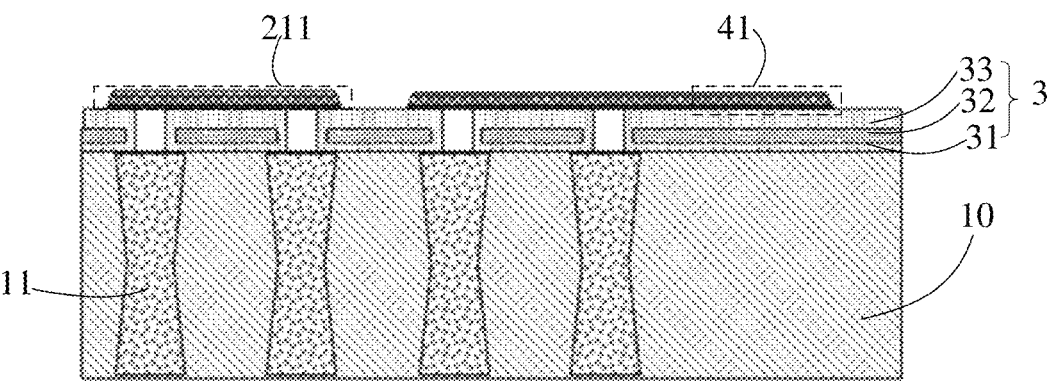
FIG. 17 is a schematic diagram of an intermediate product formed at a step S26 of a method for manufacturing a filter according to a second example of an embodiment of the present disclosure.
Figure 18:
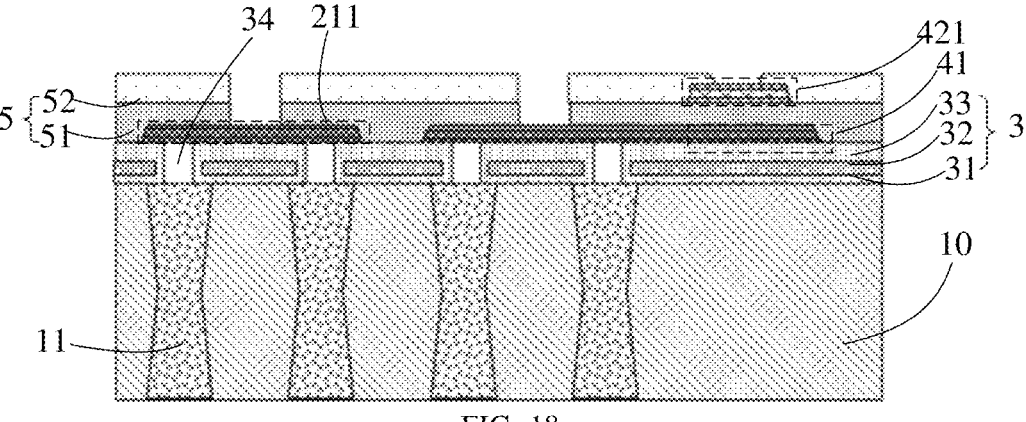
FIG. 18 is a schematic diagram of an intermediate product formed at a step S27 of a method for manufacturing a filter according to a second example of an embodiment of the present disclosure.

In a second example, a method for manufacturing the filter shown in FIG. 4 is provided. With reference to FIG. 4, the method for manufacturing a filter in this example includes steps S21 to S210, steps S21 to S25 in the second example are the same as steps S11 to S15 in the first example, and steps S29 to S210 are the same as steps S19 and S110 in the first example. Steps S26 to S28 are slightly different from those in the first example. In the second example, as shown in FIG. 17, the second connection vias 34 are not filled with the first sub-structures 211 of each first conductive structure 21 formed in step S26. That is, the first sub-structures 211 are not electrically connected to the first connection electrodes 11. As shown in FIG. 18, the third connection vias formed in step S27 are disposed corresponding to the first connection vias and the second connection vias 34, and penetrate through the first and second insulating layers 51 and 52 and the first sub-structures 211 of each first conductive structure 21, so that the second sub-structures 212 of each first conductive structure 21 formed in step S28 are electrically connected to the first connection electrodes 11 through the second connection vias 34 and the third connection vias corresponding to each other, as shown in FIG. 19.

The same steps in the second example as those in the first example are not repeated here.

In a third example: a method for manufacturing the filter shown in FIG. 5 is provided. Referring to FIG. 5, the method for manufacturing a filter in this example includes steps S31 to S39, steps S31 to S33 in the third example are the same as steps S11 to S13 in the first example, and steps S35 to S39 are the same as steps S16 to S110 in the first example. In this example, the buffer layer 3 is made of a single-layer resin material, so the number of steps in this example is less than that in the first example, and the same steps as those in the first example are not repeated here, and only the step S34, which is different from that in the first example, will be described below. In such an example, as shown in FIG. 20, the step S34 may include: forming the buffer layer 3 by a spin coating apparatus, wherein the buffer layer 3 is made of resin materials, such as: DL-1000C; and then performing the exposing and developing processes to obtain the second connection vias 34.

In a fourth example: a method for manufacturing the filter shown in FIG. 6 is provided. Referring to FIG. 6, the method for manufacturing a filter in this example includes steps S41 to S49, steps S41 to S43 in the third example are the same as steps S21 to S23 in the first example, and steps S45 to S49 are the same as steps S26 to S210 in the first example. In this example, the buffer layer 3 is made of a single-layer resin material, so the number of steps in this example is less than that in the second example, and the same steps as those in the second example are not repeated here, and only the step S44, which is different from that in the second example, will be described below. In such an example, as shown in FIG. 21, the step S44 may include: forming the buffer layer 3 by a spin coating apparatus, wherein the buffer layer 3 is made of resin materials, such as: DL-1000C; and then performing the exposing and developing processes to obtain the second connection vias 34.

It should be noted that in the embodiment of the present disclosure, a capacitance value is determined by the thickness of the first insulating layer 51, the dielectric constant of the material of the first insulating layer 51, and an area of the first plate 41 and the second plate 42 directly opposite to each other. An inductance value is determined by the number of turns of a spiral line, a pitch of the spiral line and a diameter of the spiral line. Therefore, the dielectric constant of the material of the first insulating layer 51 of the capacitor, parameters of the first plate 41 and the second plate 42, the sizes, a distance and other parameters of the first conductive structures 21 and the second conductive structures 22 of the inductor coil may be reasonably designed, thereby realizing the effect of optimizing the filter circuit.

An embodiment of the present disclosure provides an electronic apparatus, which may include the filter in any one of the embodiments.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A filter, comprising a dielectric substrate, and at least one inductor and at least one capacitor integrated on the dielectric substrate;

wherein the dielectric substrate comprises first connection vias penetrating through the dielectric substrate in a thickness direction of the dielectric substrate, and comprises a first surface and a second surface opposite to each other in the thickness direction of the dielectric substrate;

each inductor comprises first conductive structures on the first surface, second conductive structures on the second surface, and first connection electrodes in the first connection vias; the first conductive structures and the second conductive structures form a coil structure of the inductor by the first connection electrodes; and the filter further comprises a buffer layer between the first conductive structures and the first surface, and each first conductive structure is electrically connected to the first connection electrode through a second connection via penetrating through the buffer layer; and wherein the buffer layer comprises a first film layer, a second film layer, and a third film layer sequentially disposed along a direction of the first surface away from the second surface, the second film layer comprises first openings therein corresponding to the first connection vias, and an orthographic projection of each first connection via on a plane of the first surface is within an orthographic projection of the first opening corresponding to this first connection via on the plane of the first surface.

2. An electronic apparatus, comprising the filter according to claim 1.

3. The filter according to claim 1, wherein a material of the second film layer is a resin.

4. A method for manufacturing the filter according to claim 1, comprising: integrating at least one inductor and at least one capacitor on a dielectric substrate; wherein forming each inductor comprises:

providing the dielectric substrate; wherein the dielectric substrate comprises first connection vias penetrating through the dielectric substrate in a thickness direction of the dielectric substrate, and comprises a first surface and a second surface opposite to each other in the thickness direction of the dielectric substrate;

forming a first connection electrode in each first connection via;

forming a buffer layer on the first surface and second connection vias penetrating through the buffer layer;

forming first conductive structures on a side of the buffer layer away from the dielectric substrate, wherein each first conductive structure is electrically connected to the first connection electrode through the corresponding second connection via; and forming second conductive structures on the second surface, wherein the second conductive structures are electrically connected to the first conductive structures through the first connection electrodes to form a coil structure of the inductor.

5. The method according to claim 4, wherein the forming the buffer layer on the first surface and the second connection vias penetrating through the buffer layer comprises:

sequentially forming a first film layer and a second film layer on the first surface, and forming first openings penetrating through the second film layer; and forming a third film layer on a side of the second film layer away from the first film layer, and forming the second connection vias penetrating through the first film layer, the second film layer and the third film layer; wherein the first openings correspond to the first connection vias, respectively, and an orthographic projection of each first connection via on a plane of the first surface is within an orthographic projection of the corresponding first opening on the plane of the first surface.

6. The method according to claim 4, wherein the forming the first conductive structures on the side of the buffer layer away from the dielectric substrate comprises:

forming a first sub-structure of each first conductive structure on a side of the buffer layer away from the dielectric substrate, wherein the first sub-structure is insulated from the first connection electrodes by the buffer layer;

forming a first interlayer insulating layer on a side of the first sub-structure away from the dielectric substrate, and forming third connection vias penetrating through the first interlayer insulating layer; wherein the third connection vias are arranged corresponding to the first connection vias, respectively; and forming a second sub-structure on a side of the first interlayer insulating layer away from the dielectric substrate, wherein the second sub-structure is electrically connected to the first sub-structure through the corresponding third connection via to form the first conductive structure, and the second sub-structure is electrically connected to the first connection electrode through the corresponding second connection via and the corresponding third connection via.

7. The method according to claim 4, wherein the forming the first conductive structures on the side of the buffer layer away from the dielectric substrate comprises:

second connection via;

forming a first interlayer insulating layer on a side of the first sub-structure away from the dielectric substrate, and forming third connection vias penetrating through the first interlayer insulating layer; and forming a second sub-structure of each first conductive structure on a side of the first interlayer insulating layer away from the dielectric substrate, wherein the second sub-structure is electrically connected to the first sub-structure through the corresponding third connection via to form the first conductive structure.

8. The method according to claim 7, wherein a first plate of each capacitor is formed at the same time as the first sub-structure is formed.

9. The method according to claim 8, wherein the forming the first interlayer insulating layer comprises: sequentially forming a first insulating layer and a second insulating layer along a direction of the first surface away from the second surface; and the method further comprises forming a second plate of each capacitor on a side of the first insulating layer away from the dielectric substrate.

10. The method according to claim 9, wherein the forming the second plate comprises: sequentially forming a first sub-plate and a second sub-plate along the direction of the first surface away from the second surface, wherein the second sub-plate and the second sub-structure are formed through a single patterning process, the first sub-plate is located between the first insulating layer and the second insulating layer, the second sub-plate and the second sub-structure are arranged in the same layer, and the second sub-plate is electrically connected to the first sub-plate through a fourth connection via penetrating through the second insulating layer.

11. The method according to claim 10, further comprising: sequentially forming a first protective layer and a first planarization layer on a side of the second sub-structure and the second sub-plate away from the dielectric substrate, and forming a fifth connection via and a sixth connection via penetrating through the first protective layer and the first planarization layer; and forming a first connection pad and a second connection pad on a side of the first planarization layer away from the first protective layer; wherein the first connection pad is electrically connected to the corresponding second sub-structure through the fifth connection via, and the second connection pad is electrically connected to the corresponding second sub-plate through the sixth connection via.

12. A filter, comprising a dielectric substrate, and at least one inductor and at least one capacitor integrated on the dielectric substrate;

wherein the dielectric substrate comprises first connection vias penetrating through the dielectric substrate in a thickness direction of the dielectric substrate, and comprises a first surface and a second surface opposite to each other in the thickness direction of the dielectric substrate;

each inductor comprises first conductive structures on the first surface, second conductive structures on the second surface, and first connection electrodes in the first connection vias; the first conductive structures and the second conductive structures form a coil structure of the inductor by the first connection electrodes; and the filter further comprises a buffer layer between the first conductive structures and the first surface, and each first conductive structure is electrically connected to the first connection electrode through a second connection via penetrating through the buffer layer, wherein the buffer layer is a single-layer structure, and a material of the buffer layer is a resin.

13. The filter according to claim 1, wherein each first conductive structure comprises a first sub-structure and a second sub-structure arranged sequentially along a direction of the first surface away from the second surface, and the filter further comprises a first interlayer insulating layer between the first sub-structure and the second sub-structure; and the first sub-structure is electrically connected to the first connection electrode through the second connection via, and the second sub-structure is electrically connected to the first sub-structure through a third connection via penetrating through the first interlayer insulating layer.

14. The filter according to claim 13, wherein the third connection via corresponds to the second connection vias, and an orthographic projection of the third connection via on the plane of the first surface is within an orthographic projection of the first connection via corresponding to the second connection via on the plane of the first surface.

15. The filter according to claim 13, wherein each capacitor comprises a first plate and a second plate disposed sequentially along the direction of the first surface away from the second surface; and the first plate and the first sub-structure are in a same layer.

16. The filter according to claim 15, wherein the first interlayer insulating layer comprises a first insulating layer and a second insulating layer disposed sequentially along the direction of the first surface away from the second surface; and the second plate is on a side of the first insulating layer away from the dielectric substrate.

17. The filter according to claim 16, wherein the second plate comprises a first sub-plate and a second sub-plate sequentially arranged along the direction of the first surface away from the second surface, the second sub-plate and the second sub-structure are in a same layer, and the second sub-plate is electrically connected to the first sub-plate through a fourth connection via penetrating through the second insulating layer.

18. The filter according to claim 17, wherein the filter further comprises a first protective layer and a first planarization layer sequentially disposed on a side of the second sub-structure and the second sub-plate away from the dielectric substrate, a first connection pad electrically connected to the corresponding second sub-structure through a fifth connection via, and a second connection pad electrically connected to the corresponding second sub-plate through a sixth connection via; and the fifth connection via and the sixth connection via penetrate through the first protective layer and the first planarization layer.

19. A filter, comprising a dielectric substrate, and at least one inductor and at least one capacitor integrated on the dielectric substrate;

wherein the dielectric substrate comprises first connection vias penetrating through the dielectric substrate in a thickness direction of the dielectric substrate, and comprises a first surface and a second surface opposite to each other in the thickness direction of the dielectric substrate;

each inductor comprises first conductive structures on the first surface, second conductive structures on the second surface, and first connection electrodes in the first connection vias; the first conductive structures and the second conductive structures form a coil structure of the inductor by the first connection electrodes; and the filter further comprises a buffer layer between the first conductive structures and the first surface, and each first conductive structure is electrically connected to the first connection electrode through a second connection via penetrating through the buffer layer, wherein each first conductive structure comprises a first sub-structure and a second sub-structure arranged sequentially along a direction of the first surface away from the second surface, and the filter further comprises a first interlayer insulating layer between the first sub-structure and the second sub-structure; and the first sub-structure is insulated from the corresponding first connection electrode by the buffer layer, and the second sub-structure is electrically connected to the first sub-structure through a third connection via penetrating through the first interlayer insulating layer, and is electrically connected to the first connection electrode through the third connection via and the corresponding second connection via; and the third connection via corresponds to the first connection vias, and penetrates through the first interlayer insulating layer and the first sub-structure.

* * * * *